US010804922B2

(12) United States Patent
Yang et al.

(10) Patent No.: US 10,804,922 B2
(45) Date of Patent: *Oct. 13, 2020

(54) SAMPLING CLOCK GENERATING CIRCUIT AND ANALOG TO DIGITAL CONVERTER

(71) Applicant: Huawei Technologies Co., Ltd., Shenzhen (CN)

(72) Inventors: Jinda Yang, Shenzhen (CN); Liren Zhou, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/434,593

(22) Filed: Jun. 7, 2019

(65) Prior Publication Data

US 2019/0363726 A1    Nov. 28, 2019

Related U.S. Application Data

(63) Continuation of application No. 15/699,723, filed on Sep. 8, 2017, now Pat. No. 10,320,409, which is a (Continued)

(30) Foreign Application Priority Data

Mar. 11, 2015    (CN) .......................... 2015 1 0105575

(51) Int. Cl.
*H03M 3/00* (2006.01)
*H03K 3/00* (2006.01)
(Continued)

(52) U.S. Cl.
CPC .............. *H03M 1/466* (2013.01); *G06F 1/06* (2013.01); *G06F 1/10* (2013.01); *H03L 7/183* (2013.01);
(Continued)

(58) Field of Classification Search
CPC .. H03M 1/466; H03M 1/0624; H03M 1/1076; H03M 1/1215; H03L 7/183; G06F 1/10; G06F 1/06
See application file for complete search history.

(56) References Cited

U.S. PATENT DOCUMENTS 4,209,713 A * 6/1980 Satou .................. H01L 27/0921
257/376
4,303,958 A * 12/1981 Allgood .............. H01L 27/0266
257/369
(Continued)

FOREIGN PATENT DOCUMENTS

CN    201489112 U    5/2010
CN    102062798 A    5/2011
(Continued)

OTHER PUBLICATIONS

Maymandi-Nejad, et al., "A Monotonic Digitally Controlled Delay Element," IEEE Journal of Solid-State Circuits; vol. 40, No. 11, Nov. 2005, 8 pages.

*Primary Examiner* — Kenneth B Wells
(74) *Attorney, Agent, or Firm* — Conley Rose, P.C.

(57) ABSTRACT

A sampling clock generating circuit and an analog to digital converter (ADC) includes a variable resistance circuit, a NOT-gate type circuit, and a capacitor, where an input end of the NOT-gate type circuit receives a pulse signal whose period is T, an output end of the NOT-gate type circuit is coupled to one end of the capacitor, the other end of the capacitor is grounded, a power supply terminal of the NOT-gate type circuit is connected to a power supply, a ground terminal of the NOT-gate type circuit is coupled to one end of the variable resistance circuit, and the other end of the variable resistance circuit is grounded, the NOT-gate
(Continued)

type circuit is configured to output a low level when the pulse signal is a high level, and output a high level when the pulse signal is a low level.

17 Claims, 14 Drawing Sheets

Related U.S. Application Data continuation of application No. PCT/CN2015/095694, filed on Nov. 26, 2015.

(51) Int. Cl.

| | | |
|---|---|---|
| *H03M 1/46* | (2006.01) | |
| *G06F 1/06* | (2006.01) | |
| *H03L 7/183* | (2006.01) | |
| *H03M 1/06* | (2006.01) | |
| *H03M 1/10* | (2006.01) | |
| *H03M 1/12* | (2006.01) | |
| *G06F 1/10* | (2006.01) | |

(52) U.S. Cl.
CPC ....... *H03M 1/0624* (2013.01); *H03M 1/1076* (2013.01); *H03M 1/1215* (2013.01)

(56) References Cited

U.S. PATENT DOCUMENTS

| | | | |
|---|---|---|---|
| 5,081,380 A | 1/1992 | Chen | |
| 5,382,843 A * | 1/1995 | Gucyski | G05F 1/462 326/109 |
| 5,552,338 A * | 9/1996 | Kang | H01L 27/0921 148/DIG. 55 |
| 5,592,103 A * | 1/1997 | Sutherland | G06F 9/3824 326/17 |
| 5,745,394 A | 4/1998 | Tani | |
| 5,872,736 A * | 2/1999 | Keeth | G11C 7/1042 326/83 |
| 6,081,215 A | 6/2000 | Kost et al. | |
| 6,404,260 B1 * | 6/2002 | Cruz-Albrecht | G06F 1/04 327/218 |
| 6,882,292 B1 * | 4/2005 | Bardsley | H03M 1/0673 341/121 |
| 7,049,994 B2 * | 5/2006 | Tsujita | H03M 1/066 341/155 |
| 7,068,195 B1 | 6/2006 | Menkus | |
| 7,233,270 B2 * | 6/2007 | Lin | H03M 1/0604 341/118 |
| 7,570,081 B1 * | 8/2009 | Harris | H03K 19/20 326/119 |
| 7,952,400 B2 * | 5/2011 | Abe | H03K 17/223 327/142 |
| 8,125,359 B2 * | 2/2012 | Imai | H03M 1/004 341/118 |
| 8,258,825 B2 | 9/2012 | Hung et al. | |
| 8,587,460 B2 * | 11/2013 | Noguchi | H03M 1/0624 327/311 |
| 8,638,084 B1 * | 1/2014 | Abugharbieh | G05F 3/30 323/313 |
| 8,836,381 B2 * | 9/2014 | Boecker | H03K 19/01858 326/83 |
| 9,537,487 B2 * | 1/2017 | Wu | H03K 17/162 |
| 10,459,692 B2 * | 10/2019 | Takaya | H04L 9/0869 |
| 2004/0095020 A1 | 5/2004 | Kernahan et al. | |
| 2011/0157241 A1 | 6/2011 | Lee et al. | |
| 2012/0082280 A1 | 4/2012 | Mateman et al. | |
| 2014/0104087 A1 | 4/2014 | Kanagawa et al. | |

FOREIGN PATENT DOCUMENTS

| | | |
|---|---|---|
| CN | 102110423 A | 6/2011 |
| CN | 102497210 A | 6/2012 |
| CN | 103141029 A | 6/2013 |
| CN | 103731149 A | 4/2014 |
| CN | 104270154 A | 1/2015 |
| EP | 1333578 A2 | 8/2003 |
| JP | H08274600 A | 10/1996 |

\* cited by examiner

US 10,804,922 B2

SAMPLING CLOCK GENERATING CIRCUIT AND ANALOG TO DIGITAL CONVERTER

CROSS-REFERENCE TO RELATED APPLICATIONS

This application is a continuation of U.S. patent application Ser. No. 15/699,723, filed on Sep. 8, 2017, now U.S. Pat. No. 10,320,409, which is a continuation of International Patent Application No. PCT/CN2015/095694 filed on Nov. 26, 2015, which claims priority to Chinese Patent Application No. 201510105575.4 filed on Mar. 11, 2015. All of the afore-mentioned patent applications are hereby incorporated by reference in their entireties.

TECHNICAL FIELD

The present application relates to the field of digital signal processing, and in particular, to a sampling clock generating circuit and an analog to digital converter (ADC).

BACKGROUND

Due to process and device development limitations, a sampling frequency of a single ADC chip cannot be very high, and a higher sampling frequency may be implemented by means of interlaced sampling, driven by sampling clocks at different phases, of multiple ADC chips.

The sampling clocks at the different phases are generally implemented using the following solution. A logic circuit divides a clock source signal into n channels to obtain n channels of signals whose frequencies are equal to a frequency of the clock source signal divided by n and whose phases are different from each other, where n≥2 and n is an integer, and different quantities of phase inverters are respectively connected in series in transmission channels of the n channels of signals to perform delaying in order to obtain n channels of sampling clocks, and sampling points of interlaced sampling driven by the n channels of sampling clocks are the same as sampling points of sampling driven by the clock source signal.

In a process of implementing the present application, the inventor finds at least the following problems.

Based on the process limitations, features of devices in the logic circuit cannot reach theoretical features, which causes a timing offset in picoseconds (ps) between sampling points of the n channels of sampling clocks obtained using the logic circuit and sampling points of the clock source signal. Because a delay of the phase inverters connected in series in the transmission channels can be only as low as 20 ps, and the timing offset between the sampling points cannot be effectively adjusted, the interlaced sampling, driven by the n channels of sampling clocks, of the multiple ADC chips is non-uniform sampling, harmonic occurs in a signal obtained after analog-to-digital conversion, and conversion precision of the ADC is reduced.

SUMMARY

To resolve a problem of a timing offset between sampling points cannot be effectively adjusted and conversion precision of an ADC is reduced, embodiments of the present application provide a sampling clock generating circuit and an ADC. The technical solutions are as follows.

According to one aspect, an embodiment of the present application provides a sampling clock generating circuit, where the sampling clock generating circuit includes a variable resistance circuit, a NOT-gate type circuit, and a capacitor, where the NOT-gate type circuit includes an input end, an output end, a power supply terminal, and a ground terminal, the input end of the NOT-gate type circuit receives a pulse signal whose period is T, the output end of the NOT-gate type circuit is connected to one end of the capacitor, the other end of the capacitor is grounded, the power supply terminal of the NOT-gate type circuit is connected to a power supply, the ground terminal of the NOT-gate type circuit is connected to one end of the variable resistance circuit, and the other end of the variable resistance circuit is grounded, the NOT-gate type circuit is configured to output a low level when the pulse signal is a high level, and output a high level when the pulse signal is a low level, and the variable resistance circuit is configured to change a resistance value at intervals of duration T, where the resistance value is changed based on a period of n*T, and resistance values after changes within each period are different from each other, where n≥2 and n is an integer.

In a possible implementation manner of the present application, the variable resistance circuit includes a field effect transistor Q1101 and n first gating switches K1102 to K(1101+n), where each first gating switch includes an input end, an output end, and a control end, a drain of the field effect transistor Q1101 is connected to the ground terminal of the NOT-gate type circuit, a source of the field effect transistor Q1101 is grounded, and a gate of the field effect transistor Q1101 is connected to the output end of each first gating switch, the input end of each first gating switch receives a signal whose voltage value is constant, and the voltage values of the signals received by the input ends of all the first gating switches are different from each other, and the control end of each first gating switch receives a signal whose period is n*T, and within each period n*T, the signal whose period is n*T is a first level within only a time segment whose duration is T and is a second level within other time segments, and time segments within which the signals received by the control ends of all the gating switches are the first level and do not coincide, where when the signal received by the control end of the first gating switch is the first level, the input end of the first gating switch is connected to the output end of the first gating switch, and when the signal received by the control end of the first gating switch is the second level, the input end of the first gating switch is disconnected from the output end of the first gating switch.

Optionally, the field effect transistor Q1101 is a junction field effect transistor (JFET), an enhanced metal-oxide semiconductor field-effect transistor (MOSFET), or a depletion MOSFET.

Optionally, the variable resistance circuit further includes a field effect transistor Q(1102+n), where a gate of the field effect transistor Q(1102+n) is connected to the power supply, a drain of the field effect transistor Q(1102+n) is connected to the drain of the field effect transistor Q1101, and a source of the field effect transistor Q(1102+n) is connected to the source of the field effect transistor Q1101, where the field effect transistor Q(1102+n) and the field effect transistor Q1101 are both P-channel field-effect transistors, or the field effect transistor Q(1102+n) and the field effect transistor Q1101 are both N-channel field-effect transistors.

Further, the field effect transistor Q(1102+n) is a JFET, an enhanced MOSFET, or a depletion MOSFET.

Optionally, the variable resistance circuit further includes a resistor R(1103+n), where one end of the resistor R(1103+n) is connected to the drain of the field effect transistor Q1101, and the other end of the resistor (1103+n) is connected to the source of the field effect transistor Q1101.

Optionally, the sampling clock generating circuit further includes level adjustment circuits that are in a one-to-one correspondence to the first gating switches K1102 to K(1101+n), where each level adjustment circuit is connected to the input end of the first gating switch that corresponds to the level adjustment circuit, and each level adjustment circuit is configured to provide a signal whose voltage value is constant and adjustable to the input end of the first gating switch that corresponds to the level adjustment circuit, where the voltage values of the signals provided by all the level adjustment circuits are different from each other.

Further, each level adjustment circuit includes m resistors R41 to R(40+m), m+1 second gating switches K(41+m) to K(41+2*m), and a register IR, where m≥2 and m is an integer, each second gating switch includes an input end, an output end, and a control end, the m resistors R41 to R(41+m) are connected in series between the power supply and the ground, and each node that is connected in series is connected to the input end of the second gating switch, and the input ends of the second gating switches that are connected to all the nodes that are connected in series are different from each other, the output end of each second gating switch is connected to the input end of the first gating switch that corresponds to the level adjustment circuit, and the control end of each second gating switch is connected to the register IR.

In another possible implementation manner of the present application, the NOT-gate type circuit is a phase inverter, a NAND gate circuit, or a NOR gate circuit.

Optionally, the phase inverter includes a field effect transistor Q211 and a field effect transistor Q212, where a gate of the field effect transistor Q211 and a gate of the field effect transistor Q212 are both input ends of the NOT-gate type circuit, a drain of the field effect transistor Q211 and a drain of the field effect transistor Q212 are both output ends of the NOT-gate type circuit, a source of the field effect transistor Q211 is the power supply terminal of the NOT-gate type circuit, and a source of the field effect transistor Q212 is the ground terminal of the NOT-gate type circuit, where the field effect transistor Q211 is a P-channel enhanced metal-oxide semiconductor field-effect transistor MOSFET, and the field effect transistor Q212 is an N-channel MOSFET, or the field effect transistor Q211 is an N-channel MOSFET, and the field effect transistor Q212 is a P-channel MOSFET.

In still another possible implementation manner of the present application, the level of the pulse signal and the resistance value of the variable resistance circuit are changed non-simultaneously.

According to another aspect, an embodiment of the present application provides an ADC, where the ADC includes n ADC chips, and the ADC further includes a sampling clock generating circuit and a mixer, where the sampling clock generating circuit is connected to the mixer, and the mixer is connected to the n ADC chips, the sampling clock generating circuit includes a variable resistance circuit, a NOT-gate type circuit, and a capacitor, where the NOT-gate type circuit includes an input end, an output end, a power supply terminal, and a ground terminal, the input end of the NOT-gate type circuit receives a pulse signal whose period is T, the output end of the NOT-gate type circuit is connected to one end of the capacitor, the other end of the capacitor is grounded, the power supply terminal of the NOT-gate type circuit is connected to a power supply, the ground terminal of the NOT-gate type circuit is connected to one end of the variable resistance circuit, and the other end of the variable resistance circuit is grounded, the NOT-gate type circuit is configured to output a low level when the pulse signal is a high level, and output a high level when the pulse signal is a low level. The variable resistance circuit is configured to change a resistance value at intervals of duration T, where the resistance value is changed based on a period of n*T, and resistance values after changes within each period are different from each other, where n≥2 and n is an integer, and the mixer is configured to generate n channels of sampling signals whose periods are n*T, where within each period n*T, a level of an $i^{th}$ channel of sampling signals is the same as a level of an output signal of the sampling clock generating circuit within an $(i-1)^{th}$ time segment whose duration is T and is a low level within other time segments, and an $i^{th}$ ADC chip uses the $i^{th}$ channel of sampling signals as a sampling clock.

The technical solutions provided by the embodiments of the present application have the following beneficial effects.

An RC circuit is formed using a variable resistance circuit, a NOT-gate type circuit, and a capacitor, and when a pulse signal is changed from a low level to a high level, the capacitor discharges using the RC circuit such that because of a discharge function, a level of an output signal of the sampling clock generating circuit consisting of the variable resistance circuit, the NOT-gate type circuit, and the capacitor is not immediately changed from a high level to a low level with a level change of the pulse signal, but is maintained at a high level for a period of time and then changed to a low level. If a timing offset between sampling points that is caused by duration within which a high level is maintained is used to cancel a timing offset between sampling points that is generated by dividing the output signal of the sampling clock generating circuit into n channels using a logic circuit or another circuit, the timing offset between the sampling points can be adjusted. Because duration within which a high level is maintained is related to a resistance value of the variable resistance circuit, according to a relational expression between the duration within which a high level is maintained and the resistance value of the variable resistance circuit, even if adjustment precision of the resistance value of the variable resistance circuit just reaches an average level, adjustment precision of the duration within which a high level is maintained is relatively high and adjustment precision of the timing offset between the sampling points can reach hundreds of femtoseconds, thereby effectively correcting the timing offset between the sampling points, avoiding occurrence of harmonic in a signal obtained after analog-to-digital conversion, enlarging a spurious free dynamic range (SFDR), which is a ratio of a root mean square value of a carrier frequency to a root mean square value of a submaximal noise component or a root mean square value of a harmonic distortion component, and improving conversion precision of an ADC.

BRIEF DESCRIPTION OF DRAWINGS

To describe the technical solutions in some of the embodiments of the present application more clearly, the following briefly introduces the accompanying drawings describing some of the embodiments. The accompanying drawings in the following description show merely some embodiments of the present application, and a person of ordinary skill in the art may still derive other drawings from these accompanying drawings without creative efforts.

DESCRIPTION OF EMBODIMENTS

To make the objectives, technical solutions, and advantages of the present application clearer, the following further describes the embodiments of the present application in detail with reference to the accompanying drawings.

Figure 1:
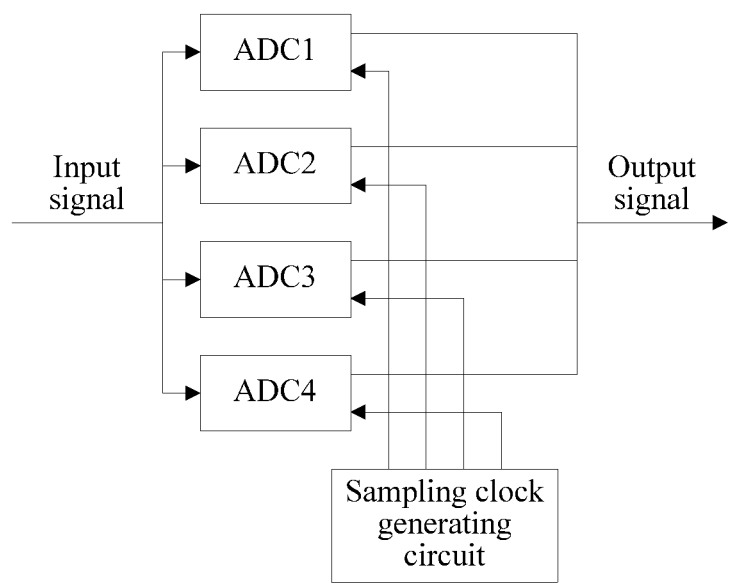
FIG. 1 is a schematic structural diagram of a circuit in which multiple ADC chips perform parallel sampling according to an embodiment of the present application.
Figure 2:
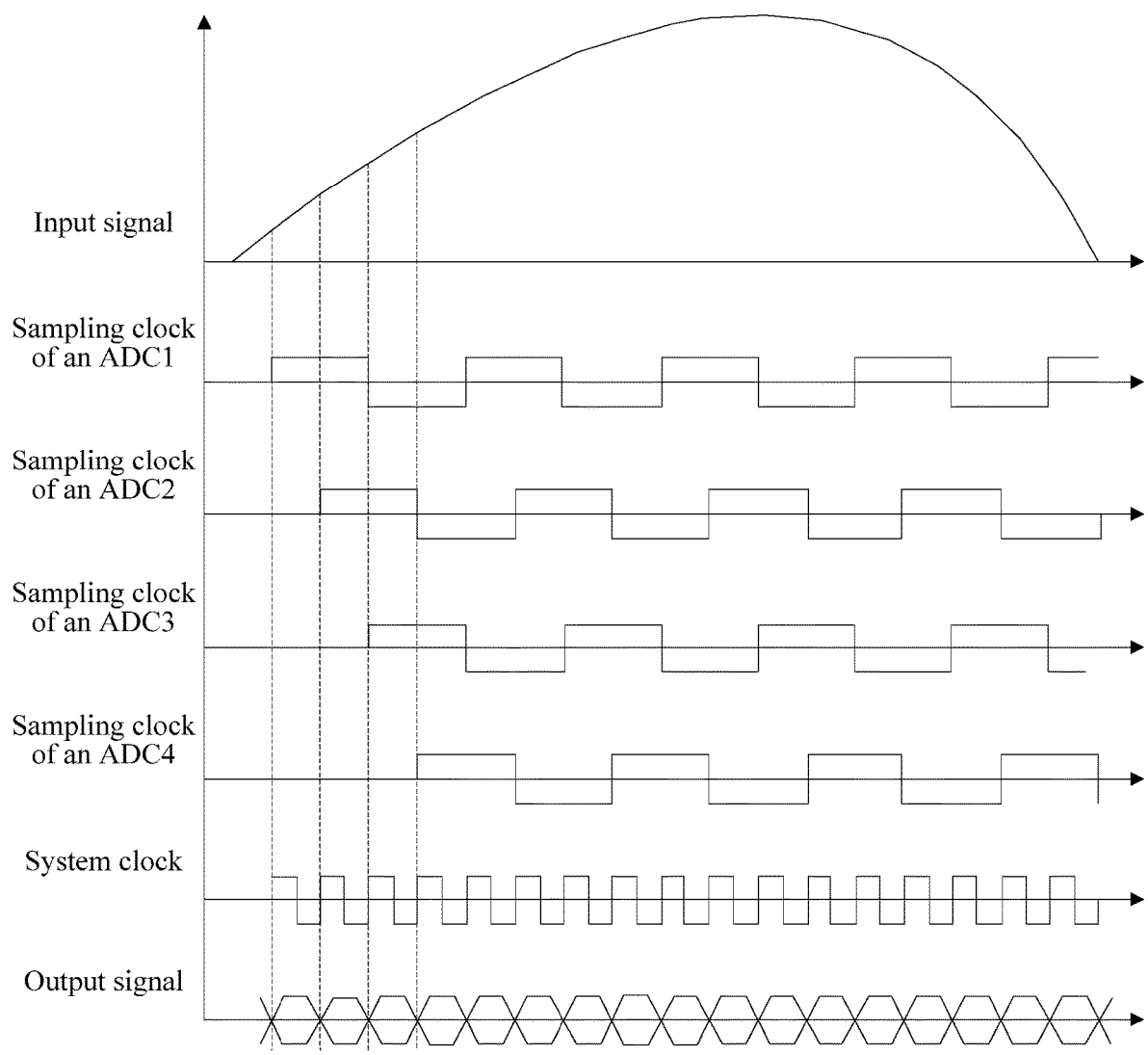
FIG. 2 is a schematic waveform diagram of parallel sampling by multiple ADC chips according to an embodiment of the present application.

The following briefly describes an application scenario of a sampling clock generating circuit provided by an embodiment of the present application with reference to FIG. 1 and FIG. 2. FIG. 1 and FIG. 2 are respectively a schematic structural diagram and a schematic waveform diagram of a circuit in which multiple ADC chips perform parallel sampling. It can be seen from FIG. 1 that the sampling clock generating circuit is connected to four ADC chips, ADC1, ADC2, ADC3, and ADC4 in order to provide sampling clocks to the four ADC chips, ADC1, ADC2, ADC3, and ADC4 respectively, and driven by the sampling clocks, the four ADC chips, ADC1, ADC2, ADC3, and ADC4 separately perform sampling on an input signal, and signals obtained by performing sampling by the four ADC chips, ADC1, ADC2, ADC3, and ADC4 form an output signal. As shown in FIG. 2, for the sampling clocks that the sampling clock generating circuit provides for the four ADC chips, ADC1, ADC2, ADC3, and ADC4, frequencies are the same and phases are different from each other such that in terms of timing, the ADC1, the ADC2, the ADC3, and the ADC4 perform sampling on the input signal periodically in order, thereby obtaining an effect of performing sampling at a sampling frequency equal to four times of the sampling clock.

It should be noted that a quantity of the ADC chips, the circuit in which the multiple ADC chips perform parallel sampling, and the waveform presented by the circuit are merely examples, and the present application is not limited thereto.

Embodiment 1

Figure 3:
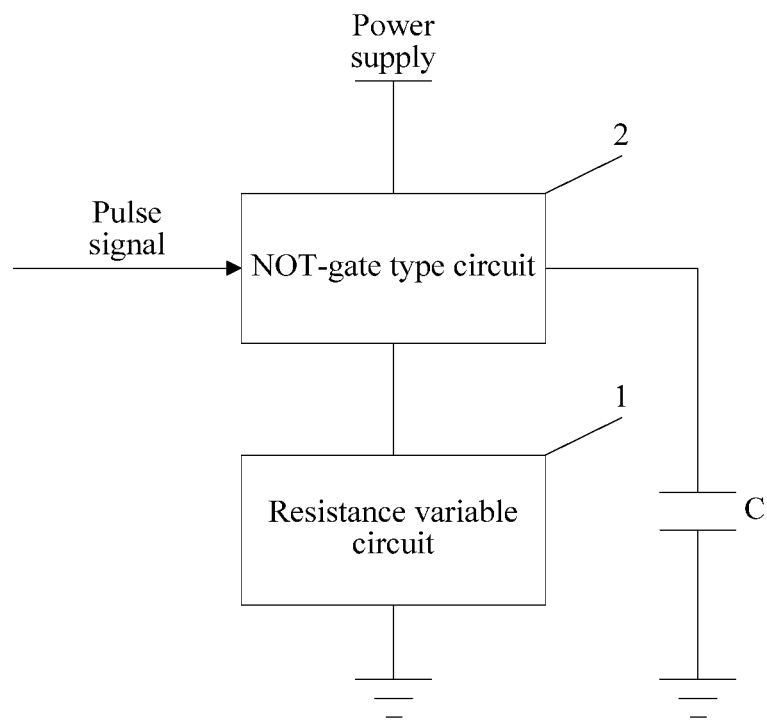
FIG. 3 is a schematic structural diagram of a sampling clock generating circuit according to Embodiment 1 of the present application.

This embodiment of the present application provides a sampling clock generating circuit. As shown in FIG. 3, the sampling clock generating circuit includes a variable resistance circuit 1, a NOT-gate type circuit 2, and a capacitor C, where the NOT-gate type circuit 2 includes an input end, an output end, a power supply terminal, and a ground terminal. The input end of the NOT-gate type circuit 2 receives a pulse signal whose period is T. The output end of the NOT-gate type circuit 2 is an output end of the sampling clock generating circuit, and the output end of the NOT-gate type circuit 2 is connected to one end of the capacitor C. The other end of the capacitor C is grounded. The power supply terminal of the NOT-gate type circuit 2 is connected to a power supply, the ground terminal of the NOT-gate type circuit 2 is connected to one end of the variable resistance circuit 1, and the other end of the variable resistance circuit 1 is grounded.

Figure 4:
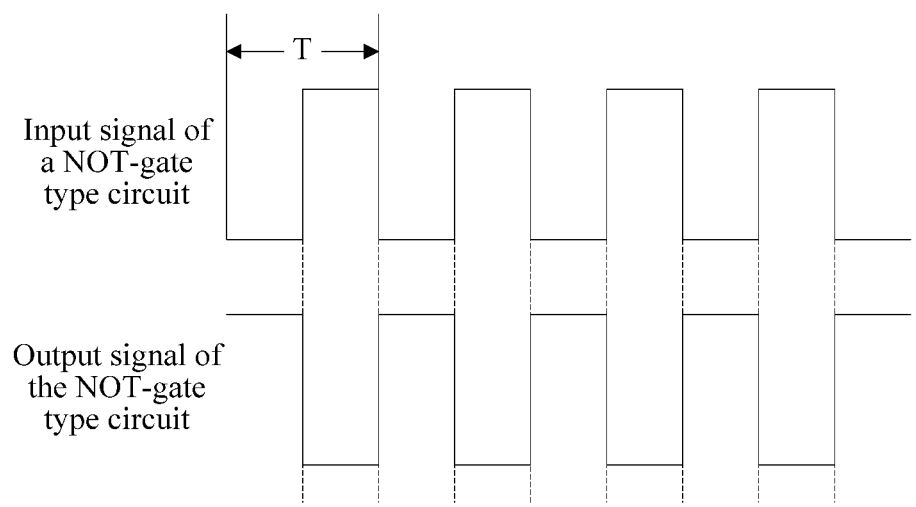
FIG. 4 is a schematic waveform diagram of an input signal and an output signal of a NOT-gate type circuit according to Embodiment 1 of the present application.

Referring to FIG. 4, the NOT-gate type circuit 2 is configured to, when the pulse signal is a high level (that is, an input signal of the NOT-gate type circuit is a high level), output a low level (that is, an output signal of the NOT-gate type circuit is a low level), and when the pulse signal is a low level (that is, the input signal of the NOT-gate type circuit is a low level), output a high level (that is, the output signal of the NOT-gate type circuit is a high level).

Figure 5:
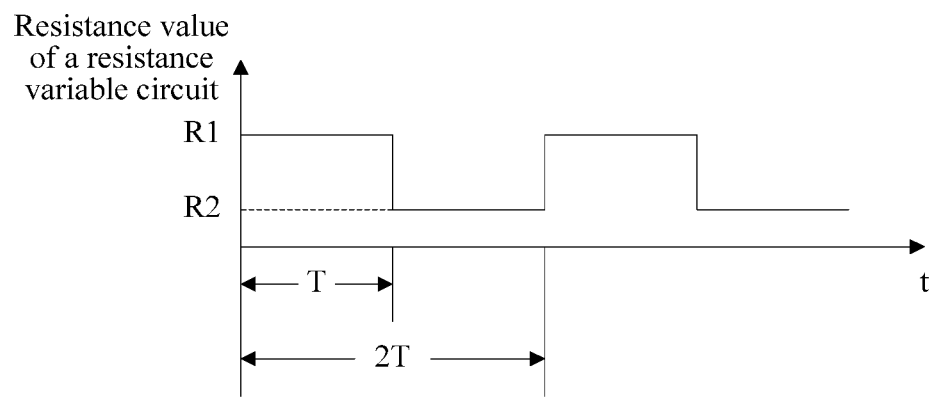
FIG. 5 is a schematic diagram of a resistance value change of a variable resistance circuit according to Embodiment 1 of the present application.

The variable resistance circuit 1 is configured to change a resistance value at intervals of duration T, where the resistance value is changed based on a period of n*T, and resistance values after changes within each period are different from each other, where n≥2 and n is an integer. For example, when n=2, as shown in FIG. 5, the resistance value of the variable resistance circuit is R1 within first duration T, is R2 within second duration T, is R1 again within third duration T, and is R2 again within fourth duration T, where R1 R2, that is, the resistance value changes at intervals of duration T, the resistance value changes based on a period of 2T, and at the beginning of each period, the resistance value is changed from R2 to R1, after duration T, the resistance value is changed from R1 to R2, and after duration T again, a period ends and another period starts, the resistance value is changed from R2 to R1, that is, the resistance values after the changes within each period are different from each other.

Further, n is equal to a quantity of ADC chips performing parallel sampling. Using FIG. 1 as an example, the ADC chips performing parallel sampling are four chips, ADC1, ADC2, ADC3, and ADC4, and in this case, n=4.

It should be noted that a high level and a low level are allegations in electrical engineering, and a high level is a high voltage relative to a low level. Further, a high level is an allowed input (or output) level when input/output of a logic gate is ensured to be 1, and a low level is an allowed input (or output) level when the input/output of the logic gate is ensured to be 0. For example, for a signal whose voltage value change range is 0-5 volts (V), when a voltage value is 0-0.25 V, the logic gate is 1, and the level is a high level, and when the voltage value is 3.5-5 V, the logic gate is 0, and the level is a low level.

Figure 6:
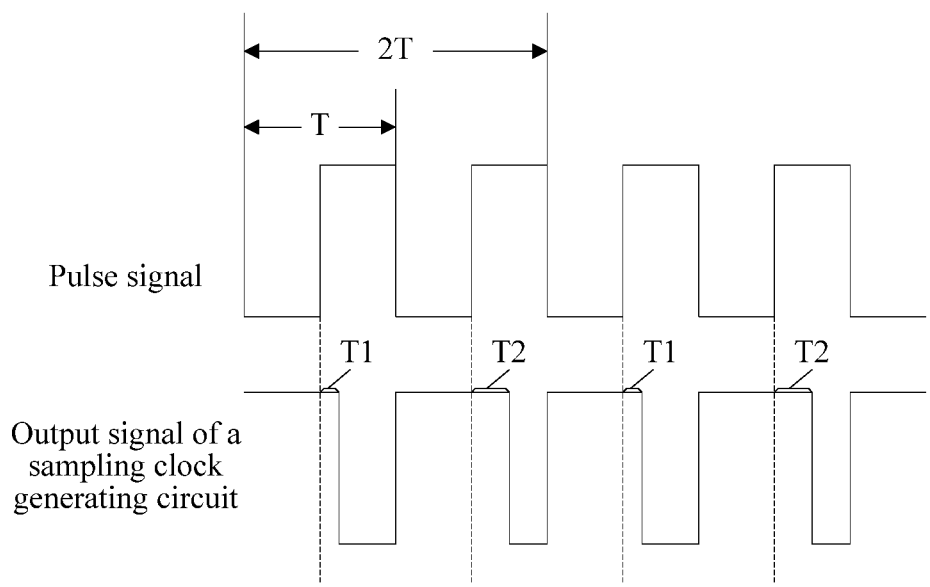
FIG. 6 is a schematic waveform diagram of a working process of the sampling clock generating circuit according to Embodiment 1 of the present application.

The following briefly describes the working principle of the sampling clock generating circuit provided by this embodiment of the present application with reference to FIG. 6.

Referring to FIG. 3, when the pulse signal is changed from a high level to a low level, the output signal of the NOT-gate type circuit 2 is a high level, and the output signal (a high level) of the NOT-gate type circuit 2 is divided into two channels, one channel charges the capacitor C, and the other channel is output as an output signal of the sampling clock generating circuit, that is, the output signal of the sampling clock generating circuit is a high level. For example, as shown in FIG. 6, (FIG. 6 corresponds to a case in which n=2), the output signal of the sampling clock generating circuit whose corresponding pulse signal is a low level is a high level.

When the pulse signal is changed from a low level to a high level, the output signal of the NOT-gate type circuit 2 is a low level, and in this case, the capacitor C, the NOT-gate type circuit 2, and the variable resistance circuit 1 form an RC discharge circuit, electricity that is charged into the capacitor C before (when the pulse signal is a low level) is released using the variable resistance circuit 1, the output signal of the sampling clock generating circuit (the output end of the NOT-gate type circuit 2 is the output end of the sampling clock generating circuit) is not changed to a low level immediately, but is maintained at a high level for a period of time, and then is changed to a low level when the electricity of the capacitor C is released to some extent. For example, as shown in FIG. 6, (FIG. 6 corresponds to the case in which n=2), the output signal of the sampling clock generating circuit whose corresponding pulse signal is a high level is maintained at a high level for a period of time and then changed to a low level.

When the pulse signal is changed from a high level to a low level again, the output signal of the NOT-gate type circuit 2 is changed to a high level again, and in this case, the capacitor C is charged, and the output signal of the sampling clock generating circuit (the output end of the NOT-gate type circuit 2 is the output end of the sampling clock generating circuit) is a high level, and the cycle repeats as shown in FIG. 6.

Duration within which the output signal of the sampling clock generating circuit is maintained at a high level is related to a speed at which the capacitor C releases the electricity. It is easily known that a larger resistance value of the variable resistance circuit 1 indicates that a speed at which the capacitor C releases the electricity is lower, and the duration within which the output signal of the sampling clock generating circuit is maintained at a high level is longer. Because the resistance value of the variable resistance circuit 1 changes at intervals of duration T, the resistance value is changed based on the period of n*T, and the resistance values after the changes within each period are different from each other, the output signal of the sampling clock generating circuit is a signal whose period is n*T, and within each period, after the pulse signal (whose period is T) is changed from a low level to a high level each time, the duration within which the output signal of the sampling clock generating circuit is maintained at a high level is different from each other. For example, when n=2, as shown in FIG. 6, the output signal of the sampling clock generating circuit is a signal whose period is 2T, and within first duration T of the period 2T, after the pulse signal is changed from a low level to a high level, the duration within which the output signal of the sampling clock generating circuit is maintained at a high level is T1, and within second duration T of the period 2T, after the pulse signal is changed from a low level to a high level, the duration within which the output signal of the sampling clock generating circuit is maintained at a high level is T2, where T1≠T2, that is, within each period, after the pulse signal (whose period is T) is changed from a low level to a high level, the duration within which the output signal of the sampling clock generating circuit is maintained at a high level is different from each other.

In this embodiment of the present application, an RC circuit is formed using a variable resistance circuit, a NOT-gate type circuit, and a capacitor, and when a pulse signal is changed from a low level to a high level, the capacitor discharges using the RC circuit such that because of a discharge function, a level of an output signal of the sampling clock generating circuit consisting of the variable resistance circuit, the NOT-gate type circuit, and the capacitor is not immediately changed from a high level to a low level with a level change of the pulse signal, but is maintained at a high level for a period of time and then changed to a low level. If a timing offset between sampling points that is caused by duration within which a high level is maintained is used to cancel a timing offset between sampling points that is generated by dividing the output signal of the sampling clock generating circuit into n channels using a logic circuit or another circuit, the timing offset between the sampling points can be adjusted. Because duration within which a high level is maintained is related to a resistance value of the variable resistance circuit, according to a relational expression between the duration within which a high level is maintained and the resistance value of the variable resistance circuit, even if adjustment precision of the resistance value of the variable resistance circuit just reaches an average level, adjustment precision of the duration within which a high level is maintained is relatively high and adjustment precision of the timing offset between the sampling points can reach hundreds of femtoseconds, thereby effectively correcting the timing offset between the sampling points, avoiding occurrence of harmonic in a signal obtained after analog-to-digital conversion, enlarging an SFDR, and improving conversion precision of an ADC.

Embodiment 2

Figure 7A:
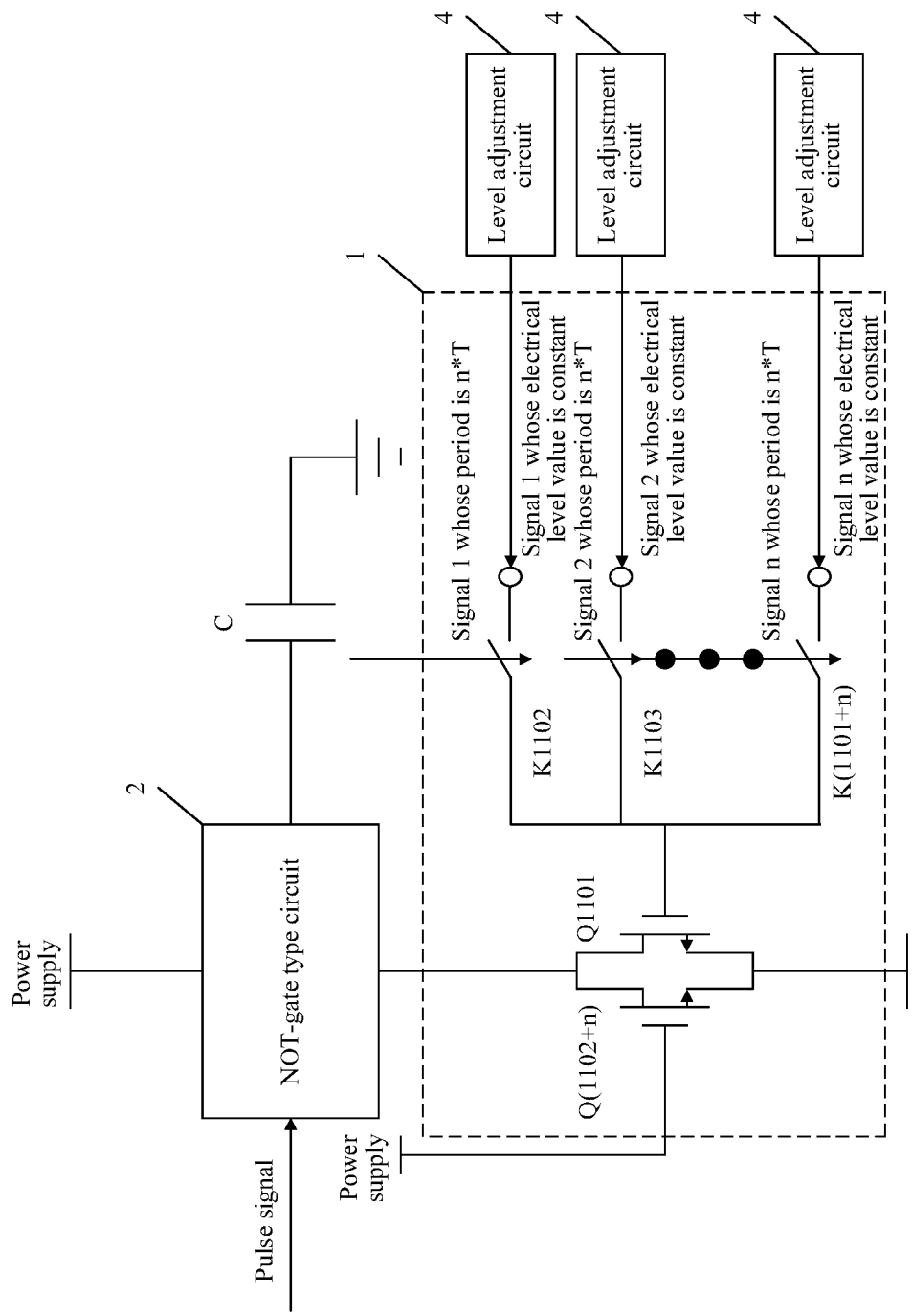
FIGS. 7A and 7B are schematic structural diagrams of a sampling clock generating circuit according to Embodiment 2 of the present application.
Figure 7B:
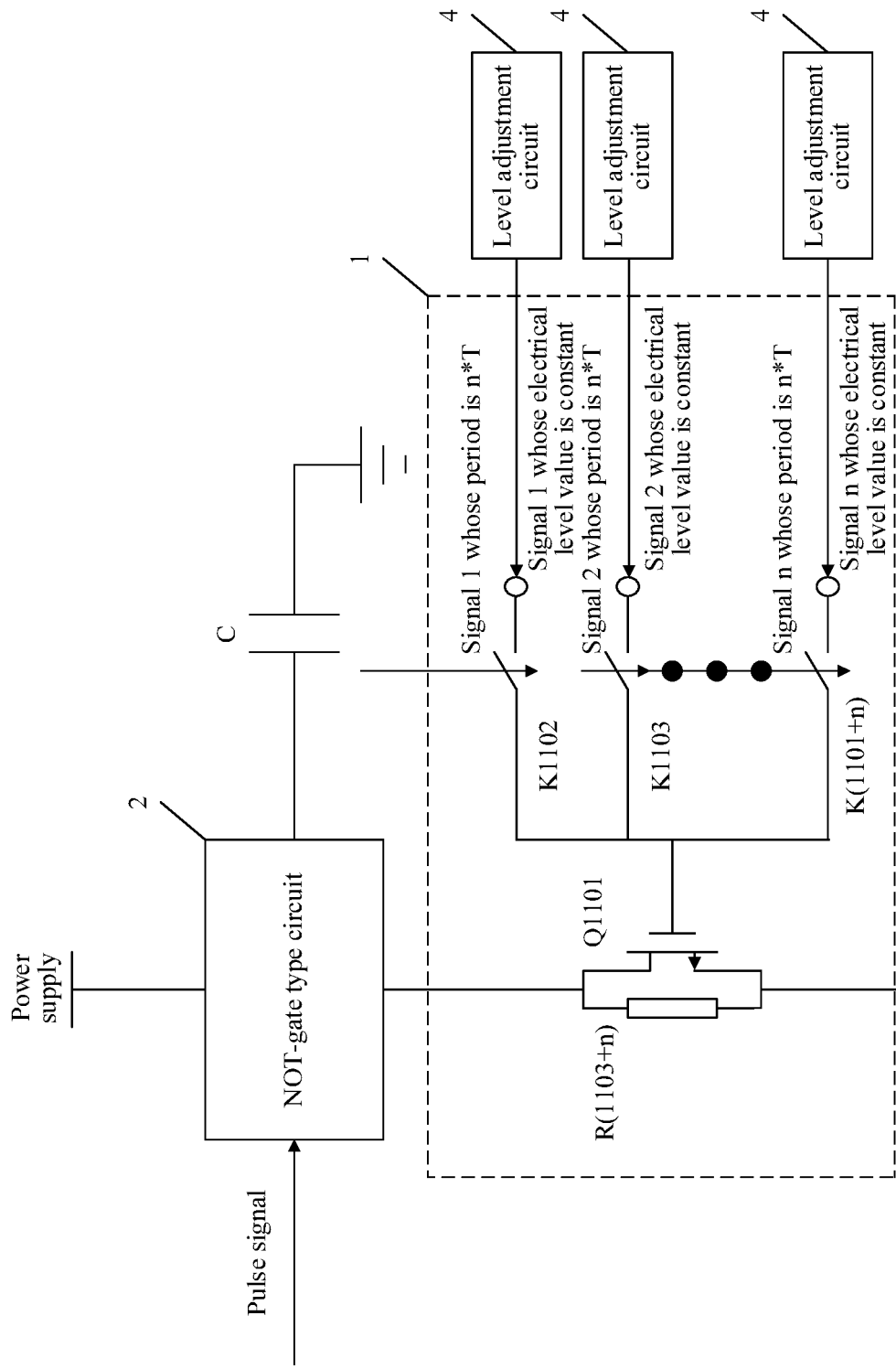

This embodiment of the present application provides a sampling clock generating circuit. A variable resistance circuit in this embodiment is implemented using a field effect transistor and a gating switch. Referring to FIG. 7A or FIG. 7B, the sampling clock generating circuit includes a variable resistance circuit 1, a NOT-gate type circuit 2, and a capacitor C, where the NOT-gate type circuit 2 includes an input end, an output end, a power supply terminal, and a ground terminal, the input end of the NOT-gate type circuit 2 receives a pulse signal whose period is T, the output end of the NOT-gate type circuit 2 is an output end of the sampling clock generating circuit, and the output end of the NOT-gate type circuit 2 is connected to one end of the capacitor C, the other end of the capacitor C is grounded, the power supply terminal of the NOT-gate type circuit 2 is connected to a power supply, the ground terminal of the NOT-gate type circuit 2 is connected to one end of the variable resistance circuit 1, and the other end of the variable resistance circuit 1 is grounded.

The NOT-gate type circuit 2 is configured to when the pulse signal is a high level, output a low level, and when the pulse signal is a low level, output a high level (as shown in FIG. 4).

The variable resistance circuit 1 is configured to change a resistance value at intervals of duration T, where the resistance value is changed based on a period of n*T, and resistance values after changes within each period are different from each other, where n≥2 and n is an integer (as shown in FIG. 5).

In this embodiment, the variable resistance circuit 1 may include a field effect transistor Q1101 and n first gating switches K1102 to K(1101+n), where each first gating switch includes an input end, an output end, and a control end.

A drain of the field effect transistor Q1101 is connected to the ground terminal of the NOT-gate type circuit 2, a source of the field effect transistor Q1101 is grounded, and a gate of the field effect transistor Q1101 is connected to the output end of each first gating switch.

Figure 8:
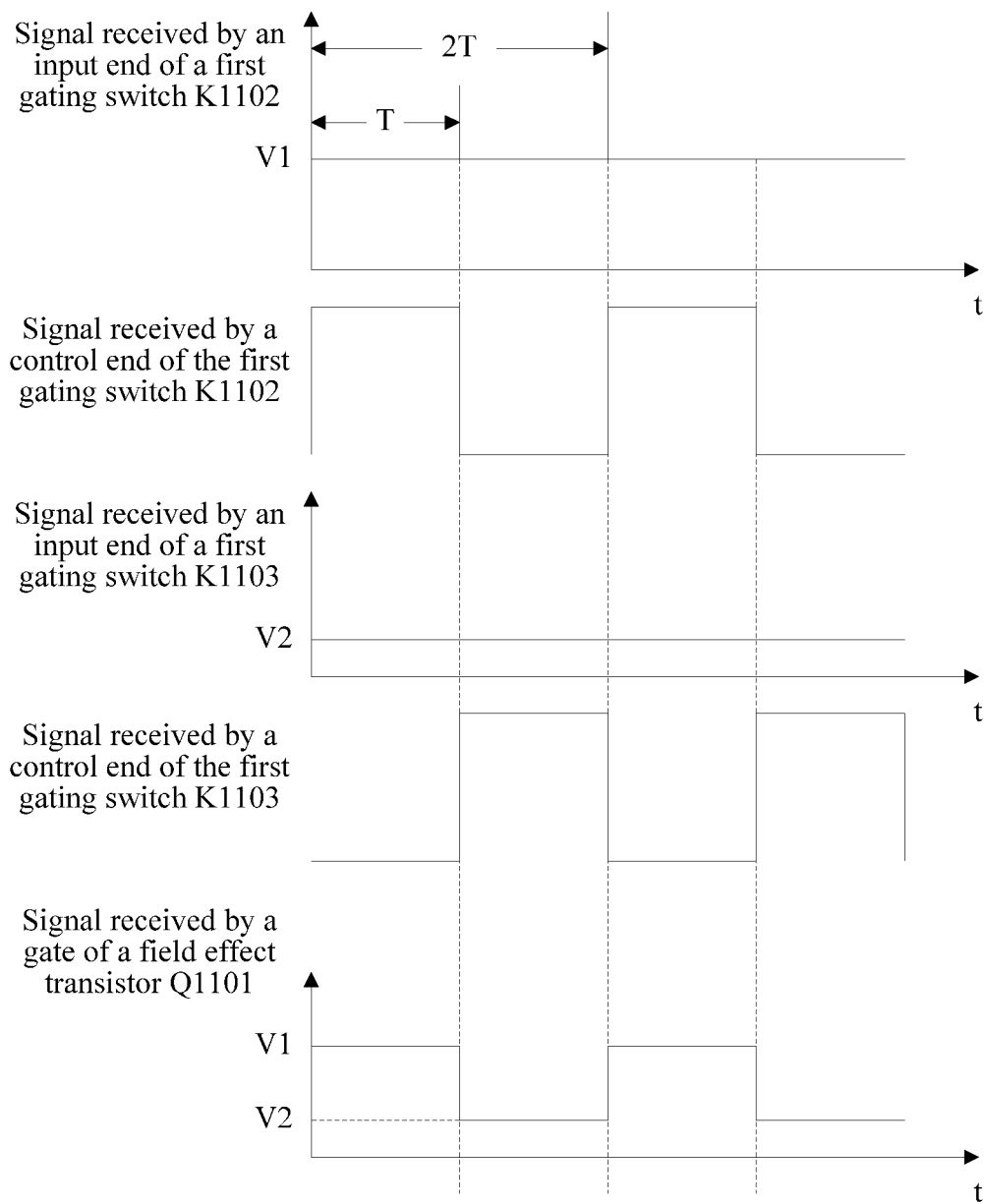
FIG. 8 is a schematic diagram of end points of first gating switches according to Embodiment 2 of the present application.

The input end of each first gating switch receives a signal whose voltage value is constant, and the voltage values of the signals received by the input ends of all the first gating switches are different from each other. For example, when n=2, as shown in FIG. 8, the input end of the first gating switch K1102 receives a signal whose voltage value is constantly V1, and an input end of a first gating switch K1103 receives a signal whose voltage value is constantly V2, where V1≠V2.

The control end of each first gating switch receives a signal whose period is n*T, and within each period n*T, the signal whose period is n*T is a first level within only a time segment whose duration is T and is a second level within other time segments, and time segments within which the signals received by the control ends of all the first gating switches are first level and do not coincide. For example, when n=2, as shown in FIG. 8, the control end of the first gating switch K1102 receives a signal whose period is 2T and that is a high level (the first level) within a first time segment whose duration is T within each period, and a control end of the first gating switch K1102 receives a signal whose period is 2T and that is a high level (the first level) within a second time segment whose duration is T within each period.

When the signal received by the control end of the first gating switch is the first level, the input end of the first gating switch is connected to the output end of the first gating switch, and when the signal received by the control end of the first gating switch is the second level, the input end of the first gating switch is disconnected from the output end of the first gating switch.

Further, the first level is a high level, and the second level is a low level, or the first level is a low level, and the second level is a high level. In FIG. 8, an example in which the first level is a high level and the second level is a low level is used for description, which is not intended to limit the present application.

It may be understood that a signal received by the gate of the field effect transistor Q1101 is a signal whose voltage value changes at intervals of duration T and whose period is n*T, and voltage values after changes within each period are different from each other. For example, when n=2, using FIG. 8 as an example, the voltage value of the signal received by the gate of the field effect transistor Q1101 is V1 within a first time segment whose duration is T, is V2 within a second time segment whose duration is T, is V1 again within a third time segment whose duration is T, and is V2 again within a fourth time segment whose duration is T, that is, the signal changes at intervals of duration T and its period is 2T, and voltage values after changes within each period are different from each other.

Further, the field effect transistor Q1101 may be an N-channel field-effect transistor, or may be a P-channel field-effect transistor. In FIG. 7A and FIG. 7B, an example in which the field effect transistor Q1101 is an N-channel field-effect transistor is used, which is not intended to limit the present application.

Optionally, the field effect transistor Q1101 may be a JFET, an enhanced MOSFET, or a depletion MOSFET.

In an implementation manner of this embodiment, as shown in FIG. 7A, the variable resistance circuit 1 may further include a field effect transistor Q(1102+n), where a gate of the field effect transistor Q(1102+n) is connected to the power supply, a drain of the field effect transistor Q(1102+n) is connected to the drain of the field effect transistor Q1101, and a source of the field effect transistor Q(1102+n) is connected to the source of the field effect transistor Q1101.

The field effect transistor Q(1102+n) and the field effect transistor Q1101 are both P-channel field-effect transistors, or the field effect transistor Q(1102+n) and the field effect transistor Q1101 are both N-channel field-effect transistors. In FIG. 7A, an example in which the field effect transistor Q(1102+n) and the field effect transistor Q1101 are both N-channel field-effect transistors is used, which is not intended to limit the present application.

Optionally, the field effect transistor Q(1102+n) may be a JFET, an enhanced MOSFET, or a depletion MOSFET.

In another implementation manner of this embodiment, as shown in FIG. 7B, the variable resistance circuit 1 may further include a resistor R(1103+n), where one end of the resistor R(1103+n) is connected to the drain of the field effect transistor Q1101, and the other end of the resistor (1103+n) is connected to the source of the field effect transistor Q1101.

It is easily known that the field effect transistor Q(1102+n) or the resistor R(1103+n) is or is equivalent to a resistor that is connected in parallel between the drain and the source of the field effect transistor Q1101, which can decrease a change amplitude of an equivalent resistor between the drain and the source of the field effect transistor Q1101, thereby decreasing a change amplitude of the resistance value of the variable resistance circuit 1. For example, before a resistor is connected in parallel, when a resistance value of the equivalent resistor between the drain and the source of the field effect transistor Q1101 is increased from r to 2*r, the change amplitude of the resistance value of the variable resistance circuit 1 is 2*r−r=r, and after a resistor whose resistance value is r is connected in parallel, when the resistance value of the equivalent resistor between the drain and the source of the field effect transistor Q1101 is increased from r to 2*r, the change amplitude of the resistance value of the variable resistance circuit 1 is 1/(1/(2*r)+1/r)−1/(1/r+1/r)=2*r/3−r/2=r/6, where r/6 is obviously less than r, therefore, either of the foregoing two implementation manners may be used to decrease the change amplitude of the resistance value of the variable resistance circuit 1, thereby implementing more precise adjustment.

In still another implementation manner of this embodiment, referring to FIG. 7A or FIG. 7B, the sampling clock generating circuit may further include level adjustment circuits 4 that are in a one-to-one correspondence to the first gating switches K1102 to K(1101+n), where each level adjustment circuit is connected to the input end of the first gating switch that corresponds to the level adjustment circuit.

Each level adjustment circuit 4 is configured to provide a signal whose voltage value is constant and adjustable to the input end of the first gating switch that corresponds to the level adjustment circuit, where the voltage values of the signals provided by all the level adjustment circuits 4 are different from each other.

The voltage value being constant and adjustable refers to that the voltage value of the signal is generally maintained unchanged at a value, but the value maintained unchanged is adjustable. For example, the voltage value of the signal is adjusted from being maintained at V1 to being maintained at V2, where V1 V2.

It may be understood that when the level adjustment circuit 4 adjusts the voltage value of the signal received by the input end of the corresponding first gating switch, the voltage value of the signal received by the gate of the field effect transistor Q1101 is changed with the voltage value of the signal. When the field effect transistor Q1101 works in a linear region, a voltage between the drain and the source of the field effect transistor Q1101 and a current of the drain are both changed with the adjusted voltage value of the signal received by the input end of the corresponding first gating switch and change speeds are different, the equivalent resistor between the drain and the source of the field effect transistor Q1101 is changed, and the resistance value of the variable resistance circuit 1 is changed.

Because a larger resistance value of the variable resistance circuit 1 indicates that when the pulse signal is changed from a high level to a low level, a discharge speed at which the capacitor C releases the electricity using the variable resistance circuit 1 is lower, and duration within which an output signal of the sampling clock generating circuit is maintained at a high level is longer, when the resistance value of the variable resistance circuit 1 is changed, the discharge speed of the capacitor C and the duration within which a high level is maintained are changed in order with the resistance value of the variable resistance circuit 1.

If a timing offset between sampling points that is caused by duration within which a high level is maintained is used to cancel a timing offset between sampling points that is generated by dividing the output signal of the sampling clock generating circuit into n channels using a logic circuit or another circuit, the timing offset between the sampling points can be adjusted and corrected. Because duration within which a high level is maintained is related to a resistance value of the variable resistance circuit, according to a relational expression between the duration within which a high level is maintained and the resistance value of the variable resistance circuit (which is other approaches and is not listed herein again), even if adjustment precision of the resistance value of the variable resistance circuit just reaches an average level, adjustment precision of the duration within which a high level is maintained is relatively high and adjustment precision of the timing offset between the sampling points can reach at least hundreds of femtoseconds.

In addition, by adjusting the voltage values of the signals received by the input ends of the first gating switches K1102 to K(1101+n), the resistance value of the variable resistance circuit 1 is adjusted, thereby improving the adjustment precision of the resistance value of the variable resistance circuit 1, therefore, the adjustment precision of the timing offset between the sampling points may further reach hundreds of femtoseconds, and conversion precision of an ADC is further improved.

Figure 9:
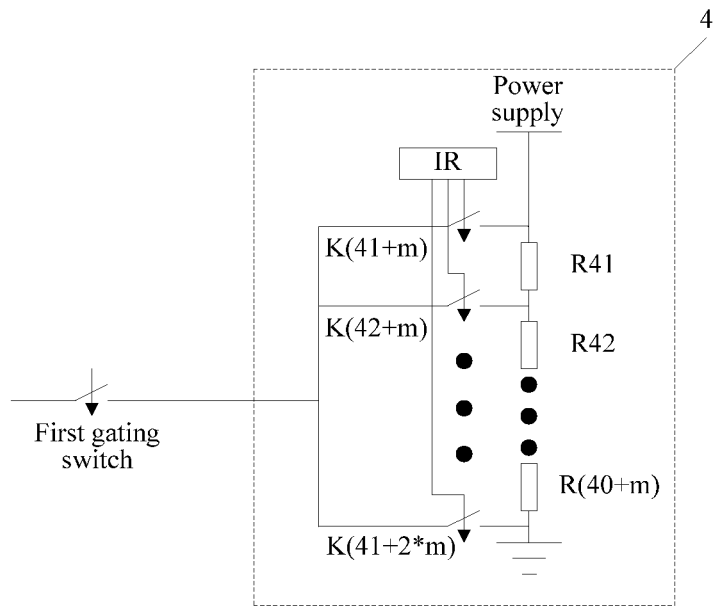
FIG. 9 is a schematic structural diagram of a level adjustment circuit according to Embodiment 2 of the present application.

Optionally, as shown in FIG. 9, each level adjustment circuit 4 may include m resistors R41 to R(40+m), m+1 second gating switches K(41+m) to K(41+2*m), and a register IR, where m≥2 and m is an integer. Each second gating switch includes an input end, an output end, and a control end. The m resistors R41 to R(41+m) are connected in series between the power supply and the ground, and each node that is connected in series is connected to the input end of the second gating switch, and the input ends of the second gating switches that are connected to all the nodes that are connected in series are different from each other. The output end of each second gating switch is connected to the input end of the first gating switch that corresponds to the level adjustment circuit 4, and the control end of each second gating switch is connected to the register IR.

It may be understood that the resistors R41 to R(40+m) that are connected in series between the power supply and the ground divide a power supply voltage into m+1 levels, and voltages of the levels are different from each other. Each node that is connected in series is connected to the input end of the second gating switch, and the input ends of the second gating switches that are connected to the nodes that are connected in series are different from each other. Therefore, each second gating switch receives a signal with a different voltage. Using different control signals output by the register IR, one of the second gating switches K(41+m) to K(41+2*m) can be controlled to be connected, and a voltage of a node connected to the connected second gating switch is the voltage of the signal received by the input end of the first gating switch such that the voltage value of the signal received by the input end of the first gating switch is changed by connecting different second gating switches.

Further, a value of m depends on adjustment precision of the voltage value of the signal received by the input end of the first gating switch, for example, if the power supply voltage is 5 V and the adjustment precision is 1 V, the power supply voltage is divided into six levels, 5 V, 4 V, 3 V, 2 V, 1 V, and 0 V, that is, m=5.

In specific implementation, the NOT-gate type circuit 2 may be a phase inverter, a NAND gate circuit, or a NOR gate circuit. When the NOT-gate type circuit 2 is any one of a phase inverter, a NAND gate circuit, and a NOR gate circuit, a specific implementation circuit thereof may have several implementation manners. For example, when the NOT-gate type circuit 2 is a phase inverter, there may be at least the following implementation manners.

Figure 10A:
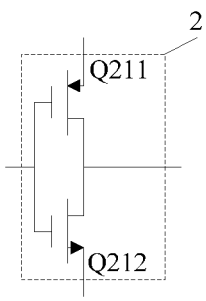
FIGS. 10A, 10B, 10C, 10D, 10E, and 10F are schematic structural diagrams of a NOT-gate type circuit according to Embodiment 2 of the present application.

In a first implementation manner, referring to FIG. 10A, the phase inverter may include a field effect transistor Q211 and a field effect transistor Q212, where a gate of the field effect transistor Q211 and a gate of the field effect transistor Q212 are both input ends of the NOT-gate type circuit 2, a drain of the field effect transistor Q211 and a drain of the field effect transistor Q212 are both output ends of the NOT-gate type circuit 2, a source of the field effect transistor Q211 is the power supply terminal of the NOT-gate type circuit 2, and a source of the field effect transistor Q212 is the ground terminal of the NOT-gate type circuit 2.

The field effect transistor Q211 is a P-channel enhanced MOSFET, and the field effect transistor Q212 is an N-channel MOSFET, or the field effect transistor Q211 is an N-channel MOSFET, and the field effect transistor Q212 is a P-channel MOSFET. In FIG. 10A, an example in which the field effect transistor Q211 is a P-channel enhanced MOS- FET and the field effect transistor Q212 is an N-channel MOSFET is used, which is not intended to limit the present application.

Figure 10B:
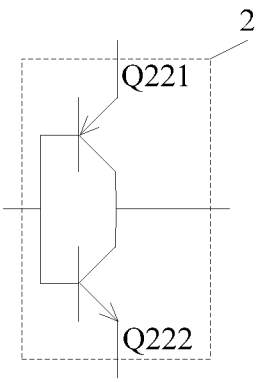

In a second implementation manner, referring to FIG. 10B, the phase inverter may include a bipolar junction transistor Q221 and a bipolar junction transistor Q222, where a base of the bipolar junction transistor Q221 and a base of the bipolar junction transistor Q222 are both input ends of the NOT-gate type circuit 2, an emitter of the bipolar junction transistor Q221 and an emitter of the bipolar junction transistor Q222 are output ends of the NOT-gate type circuit 2, a collector of the bipolar junction transistor Q221 is the power supply terminal of the NOT-gate type circuit 2, and a collector of the bipolar junction transistor Q222 is the ground terminal of the NOT-gate type circuit 2.

The bipolar junction transistor Q221 is an NPN bipolar junction transistor, and the bipolar junction transistor Q222 is a PNP bipolar junction transistor, or the Q221 is a PNP bipolar junction transistor, and the bipolar junction transistor Q222 is an NPN bipolar junction transistor. In FIG. 10B, an example in which the bipolar junction transistor Q221 is an NPN bipolar junction transistor, and the bipolar junction transistor Q222 is a PNP bipolar junction transistor is used, which is not intended to limit the present application.

Figure 10C:
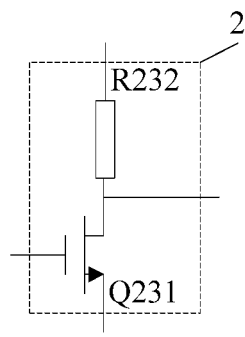

In a third implementation manner, as shown in FIG. 10C, the phase inverter may include a field effect transistor Q231 and a resistor R232, where a gate of the field effect transistor Q231 is the input end of the NOT-gate type circuit 2, a drain of the field effect transistor Q231 is the output end of the NOT-gate type circuit 2, a source of the field effect transistor Q231 is the ground terminal of the NOT-gate type circuit 2, the drain of the field effect transistor Q231 is connected to one end of the resistor R232, and the other end of the resistor R232 is the power supply terminal of the NOT-gate type circuit 2.

The field effect transistor Q231 is an enhanced MOSFET.

Further, the field effect transistor Q231 may be an N-channel field-effect transistor, or may be a P-channel field-effect transistor. In FIG. 10C, an example in which the field effect transistor Q231 is an N-channel field-effect transistor is used, which is not intended to limit the present application.

Figure 10D:
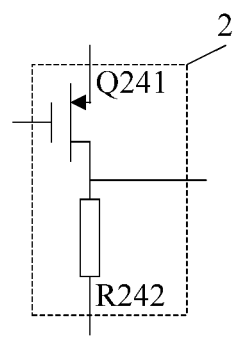

In a fourth implementation manner, as shown in FIG. 10D, the phase inverter may include a field effect transistor Q241 and a resistor R242, where a gate of the field effect transistor Q241 is the input end of the NOT-gate type circuit 2, a source of the field effect transistor Q241 is the output end of the NOT-gate type circuit 2, a drain of the field effect transistor Q241 is the power supply terminal of the NOT-gate type circuit 2, the source of the field effect transistor Q241 is connected to one end of the resistor R242, and the other end of the resistor R242 is the ground terminal of the NOT-gate type circuit 2.

The field effect transistor Q241 is an enhanced MOSFET.

Further, the field effect transistor Q241 may be a P-channel field-effect transistor, or may be an N-channel field-effect transistor. In FIG. 10D, an example in which the field effect transistor Q241 is a P-channel field-effect transistor is used, which is not intended to limit the present application.

For another example, when the NOT-gate type circuit 2 is a NAND gate circuit, the NAND gate circuit may use the following implementation manners.

Figure 10E:
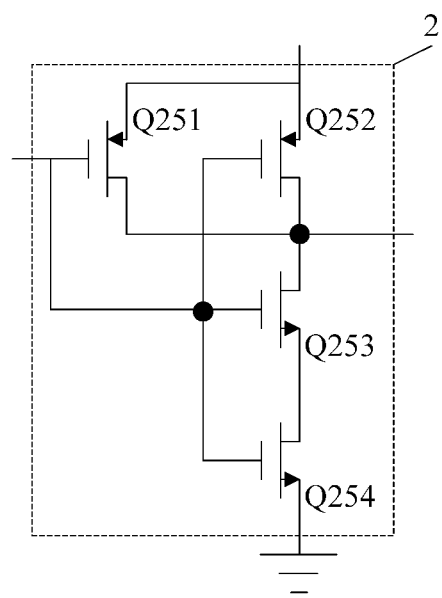

Referring to FIG. 10E, the NAND gate circuit may include a field effect transistor Q251, a field effect transistor Q252, a field effect transistor Q253, and a field effect transistor Q254, where a gate of the field effect transistor Q251, a gate of the field effect transistor Q252, a gate of the field effect transistor Q253, and a gate of the field effect transistor Q254 are all input ends of the NOT-gate type circuit 2, a drain of the field effect transistor Q251, a drain of the field effect transistor Q252, and a drain of the field effect transistor Q253 are all output ends of the NOT-gate type circuit 2, a source of the field effect transistor Q251 and a source of the field effect transistor Q252 are both power supply terminals of the NOT-gate type circuit 2, a source of the field effect transistor Q253 is connected to a drain of the field effect transistor Q254, and a source of the field effect transistor Q254 is the ground terminal of the NOT-gate type circuit 2.

The field effect transistor Q251 and the field effect transistor Q252 are both P-channel field-effect transistors, and the field effect transistor Q253 and the field effect transistor Q254 are both N-channel field-effect transistors, or the field effect transistor Q251 and the field effect transistor Q252 are both N-channel field-effect transistors, and the field effect transistor Q253 and the field effect transistor Q254 are both P-channel field-effect transistors. In FIG. 10E, an example in which the field effect transistor Q251 and the field effect transistor Q252 are both P-channel field-effect transistors, and the field effect transistor Q253 and the field effect transistor Q254 are both N-channel field-effect transistors is used, which is not intended to limit the present application.

For another example, when the NOT-gate type circuit 2 is a NOR gate circuit, the NOR gate circuit may use the following implementation manners.

Figure 10F:
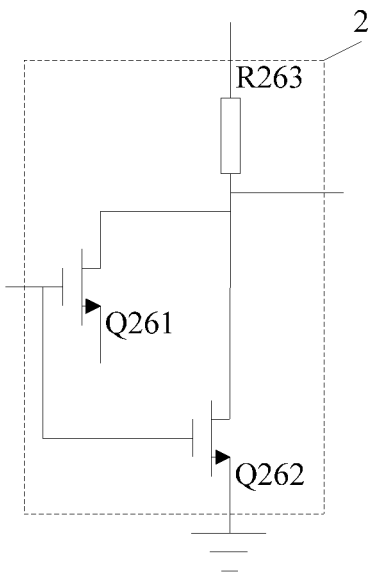

Referring to FIG. 10F, the NOR gate circuit may include a field effect transistor Q261, a field effect transistor Q262, and a resistor R263, where a gate of the field effect transistor Q261 and a gate of the field effect transistor Q262 are both input ends of the NOT-gate type circuit 2, a drain of the field effect transistor Q261 and a drain of the field effect transistor Q262 are both output ends of the NOT-gate type circuit 2, a source of the field effect transistor Q261 and a source of the field effect transistor Q262 are both power supply terminals of the NOT-gate type circuit 2, one end of the resistor R263 is the ground terminal of the NOT-gate type circuit 2, and the other end of the resistor R263 is connected to both the drain of the field effect transistor Q261 and the drain of the field effect transistor Q262.

The field effect transistor Q261 and the field effect transistor Q262 are both N-channel field-effect transistors, or the field effect transistor Q261 and the field effect transistor Q262 are both P-channel field-effect transistors. In FIG. 10F, an example in which the field effect transistor Q261 and the field effect transistor Q262 are both N-channel field-effect transistors is used, which is not intended to limit the present application.

In comprehensive considerations to the foregoing implementation manners, when the NOT-gate type circuit 2 uses a phase inverter, compared with using a NAND gate circuit or a NOR gate circuit, fewer devices are required, smaller space is occupied, and costs are also lower, therefore, the phase inverter is used to implement the NOT-gate type circuit 2. Further, in the provided four circuit implementing the phase inverter, compared with other three implementation manners, in the first implementation manner, only a field effect transistor is used and a resistor is not involved such that an integration level and stability are both relatively good. Therefore, the first implementation manner is an optimal implementation manner.

Figure 11:
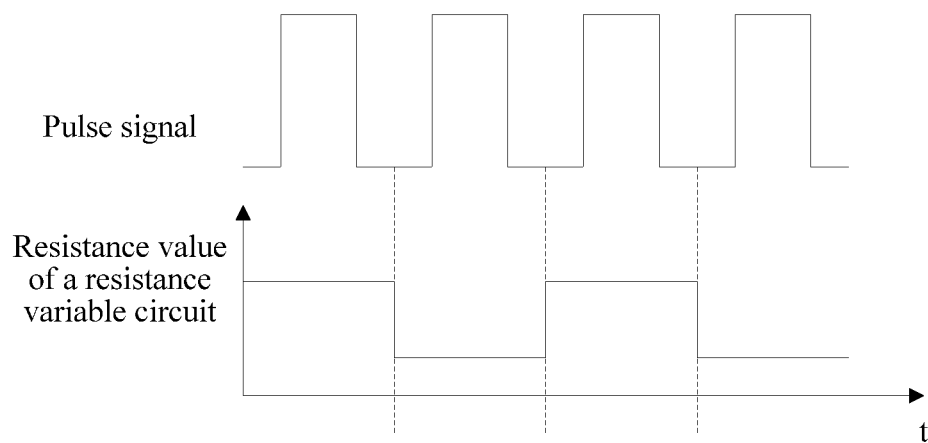
FIG. 11 is a schematic diagram of changes of a pulse signal and a resistance value of a variable resistance circuit according to Embodiment 2 of the present application.

In still another implementation manner of this embodiment, referring to FIG. 11, the level of the pulse signal and the resistance value of the variable resistance circuit 1 are changed non-simultaneously.

In specific implementation, a level timing of the pulse signal and a resistance value timing of the variable resistance circuit 1 may be adjusted, for example, a pulse signal of a required timing is output by directly controlling a pulse signal generator, or a phase inverter or another device is used to delay the pulse signal, to implement non-simultaneous changes of the level of the pulse signal and the resistance value of the variable resistance circuit 1.

It is easily known that the level of the pulse signal and the resistance value of the variable resistance circuit are changed non-simultaneously such that when the pulse signal is changed from a low level to a high level, the resistance value of the variable resistance circuit remains unchanged, and voltages at two ends of the variable resistance circuit are stable, thereby improving stability of the sampling clock generating circuit.

It should be noted that in this embodiment, positive and negative voltages of the power supply, and types of the field effect transistors or the bipolar junction transistors, such as an N-channel field-effect transistor, a P-channel field-effect transistor, a JFET, an enhanced MOSFET, a depletion MOSFET, a PNP bipolar junction transistor, or an NPN bipolar junction transistor, need to be cooperated with each other, as long as a required effect is reached.

In this embodiment of the present application, an RC circuit is formed using a variable resistance circuit, a NOT-gate type circuit, and a capacitor, and when a pulse signal is changed from a low level to a high level, the capacitor discharges using the RC circuit such that because of a discharge function, a level of an output signal of the sampling clock generating circuit consisting of the variable resistance circuit, the NOT-gate type circuit, and the capacitor is not immediately changed from a high level to a low level with a level change of the pulse signal, but is maintained at a high level for a period of time and then changed to a low level. If a timing offset between sampling points that is caused by duration within which a high level is maintained is used to cancel a timing offset between sampling points that is generated by dividing the output signal of the sampling clock generating circuit into n channels using a logic circuit or another circuit, the timing offset between the sampling points can be adjusted. Because duration within which a high level is maintained is related to a resistance value of the variable resistance circuit, according to a relational expression between the duration within which a high level is maintained and the resistance value of the variable resistance circuit, even if adjustment precision of the resistance value of the variable resistance circuit just reaches an average level, adjustment precision of the duration within which a high level is maintained is relatively high and adjustment precision of the timing offset between the sampling points can reach hundreds of femtoseconds, thereby effectively correcting the timing offset between the sampling points, avoiding occurrence of harmonic in a signal obtained after analog-to-digital conversion, enlarging an SFDR, and improving conversion precision of an ADC.

Embodiment 3

This embodiment of the present application provides a sampling clock generating circuit, and a difference from Embodiment 2 lies in that, a variable resistance circuit in this embodiment is implemented using resistors and gating switches that are in a one-to-one correspondence, and branches, obtained after the resistors are connected in series to the gating switches that respectively correspond to the resistors, are connected in parallel.

Figure 12:
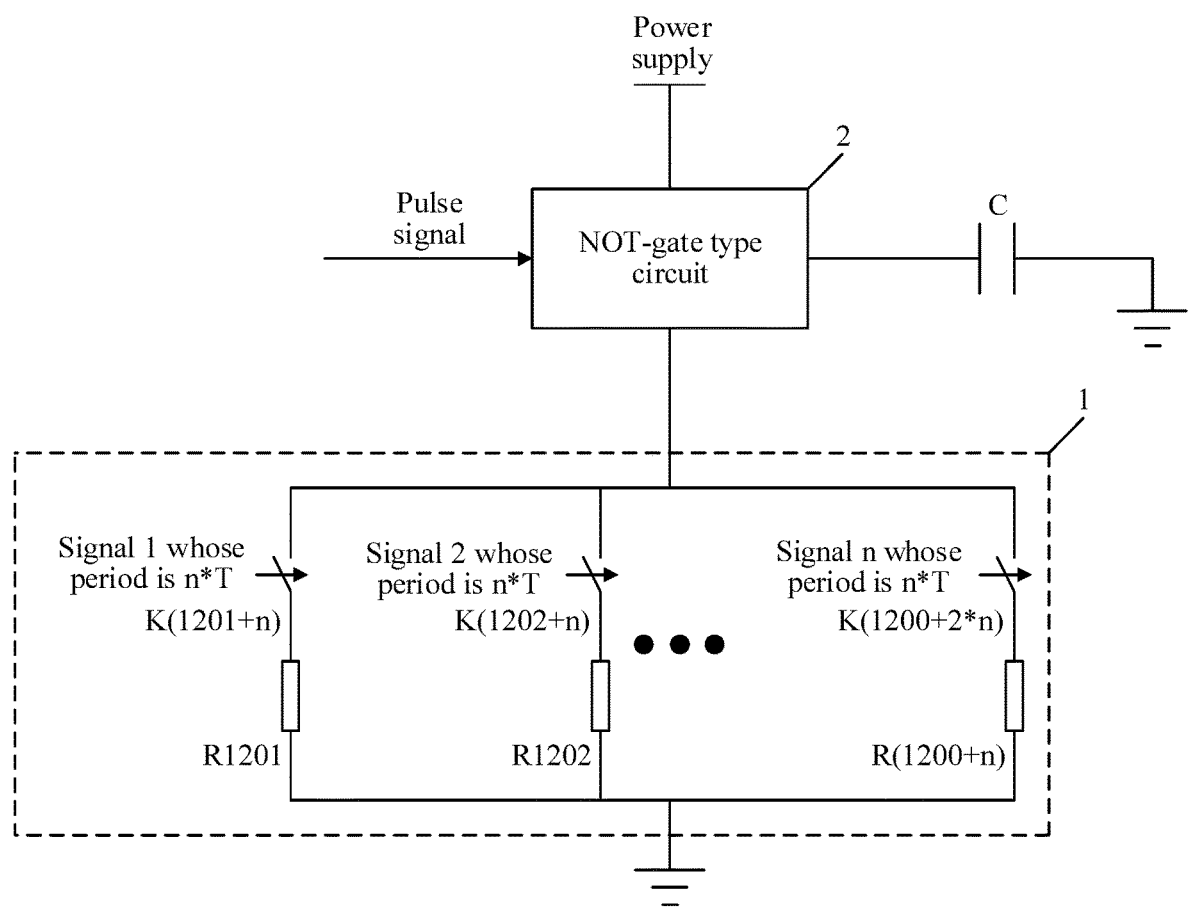
FIG. 12 is a schematic structural diagram of a sampling clock generating circuit according to Embodiment 3 of the present application.

Further, as shown in FIG. 12, the variable resistance circuit 1 may include n resistors R1201 to R(1200+n) and n third gating switches K(1201+n) to K(1200+2*n) that are in a one-to-one correspondence to the n the resistors R1201 to R(1200+n), where resistance values of the resistors are different from each other, and each third gating switch includes an input end, an output end, and a control end. Branches formed by connecting the resistors in series to the third gating switches that respectively correspond to the resistors are connected in parallel between the ground terminal of the NOT-gate type circuit 2 and the ground. The control end of each third gating switch receives a signal whose period is n*T, and within each period n*T, the signal whose period is n*T is a first level within only a time segment whose duration is T and is a second level within other time segments, and time segments within which the signals received by the control ends of all the third gating switches are first level and do not coincide.

When the signal received by the control end of the third gating switch is the first level, the input end of the third gating switch is connected to the output end of the third gating switch, and when the signal received by the control end of the third gating switch is the second level, the input end of the third gating switch is disconnected from the output end of the third gating switch.

Further, the first level is a high level, and the second level is a low level, or the first level is a low level, and the second level is a high level.

In this embodiment of the present application, an RC circuit is formed using a variable resistance circuit, a NOT-gate type circuit, and a capacitor, and when a pulse signal is changed from a low level to a high level, the capacitor discharges using the RC circuit such that because of a discharge function, a level of an output signal of the sampling clock generating circuit consisting of the variable resistance circuit, the NOT-gate type circuit, and the capacitor is not immediately changed from a high level to a low level with a level change of the pulse signal, but is maintained at a high level for a period of time and then changed to a low level. If a timing offset between sampling points that is caused by duration within which a high level is maintained is used to cancel a timing offset between sampling points that is generated by dividing the output signal of the sampling clock generating circuit into n channels using a logic circuit or another circuit, the timing offset between the sampling points can be adjusted. Because duration within which a high level is maintained is related to a resistance value of the variable resistance circuit, according to a relational expression between the duration within which a high level is maintained and the resistance value of the variable resistance circuit, even if adjustment precision of the resistance value of the variable resistance circuit just reaches an average level, adjustment precision of the duration within which a high level is maintained is relatively high and adjustment precision of the timing offset between the sampling points can reach hundreds of femtoseconds, thereby effectively correcting the timing offset between the sampling points, avoiding occurrence of harmonic in a signal obtained after analog-to-digital conversion, enlarging an SFDR, and improving conversion precision of an ADC.

Embodiment 4

This embodiment of the present application provides a sampling clock generating circuit, and a difference from Embodiment 2 lies in that, a variable resistance circuit in this embodiment is implemented using resistors and gating switches that are in a one-to-one correspondence, and branches, obtained after the resistors are connected in parallel to the gating switches that respectively correspond to the resistors, are connected in series.

Figure 13:
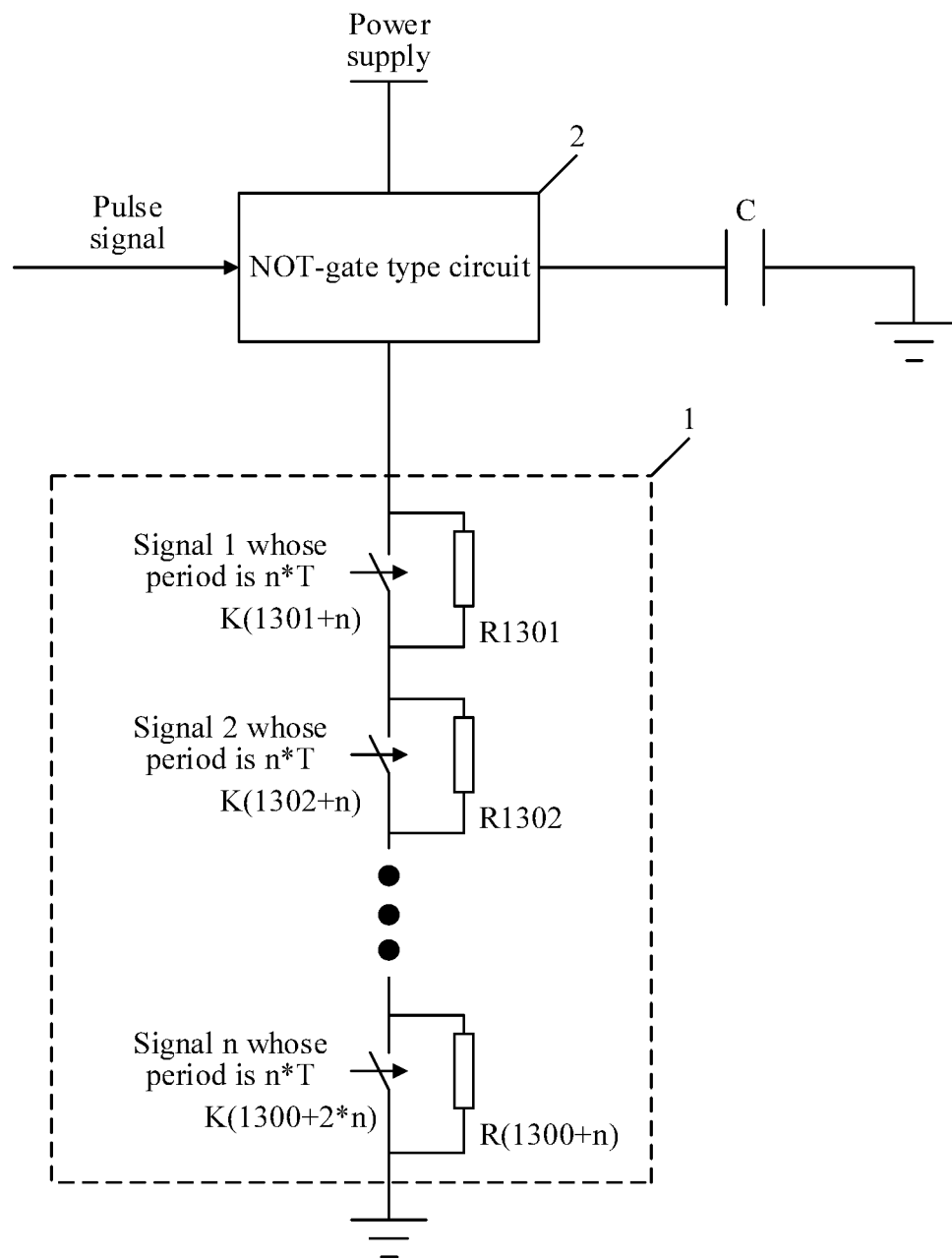
FIG. 13 is a schematic structural diagram of a sampling clock generating circuit according to Embodiment 4 of the present application.

Further, as shown in FIG. 13, the variable resistance circuit 1 may include n resistors R1301 to R(1300+n) and n fourth gating switches K(1301+n) to K(1300+2*n) that are in a one-to-one correspondence to the n the resistors R1301 to R(1300+n), where resistance values of the resistors are different from each other, and each fourth gating switch includes an input end, an output end, and a control end. Branches formed by connecting the resistors in parallel to the fourth gating switches that respectively correspond to the resistors are connected in series between the ground terminal of the NOT-gate type circuit 2 and the ground. The control end of each fourth gating switch receives a signal whose period is n*T, and within each period n*T, the signal whose period is n*T is a first level within only a time segment whose duration is T and is a second level within other time segments, and time segments within which the signals received by the control ends of all the fourth gating switches are second level and do not coincide.

When the signal received by the control end of the fourth gating switch is the first level, the input end of the fourth gating switch is connected to the output end of the fourth gating switch, and when the signal received by the control end of the fourth gating switch is the second level, the input end of the fourth gating switch is disconnected from the output end of the fourth gating switch.

Further, the first level is a high level, and the second level is a low level, or the first level is a low level, and the second level is a high level.

In this embodiment of the present application, an RC circuit is formed using a variable resistance circuit, a NOT-gate type circuit, and a capacitor, and when a pulse signal is changed from a low level to a high level, the capacitor discharges using the RC circuit such that because of a discharge function, a level of an output signal of the sampling clock generating circuit consisting of the variable resistance circuit, the NOT-gate type circuit, and the capacitor is not immediately changed from a high level to a low level with a level change of the pulse signal, but is maintained at a high level for a period of time and then changed to a low level. If a timing offset between sampling points that is caused by duration within which a high level is maintained is used to cancel a timing offset between sampling points that is generated by dividing the output signal of the sampling clock generating circuit into n channels using a logic circuit or another circuit, the timing offset between the sampling points can be adjusted. Because duration within which a high level is maintained is related to a resistance value of the variable resistance circuit, according to a relational expression between the duration within which a high level is maintained and the resistance value of the variable resistance circuit, even if adjustment precision of the resistance value of the variable resistance circuit just reaches an average level, adjustment precision of the duration within which a high level is maintained is relatively high and adjustment precision of the timing offset between the sampling points can reach hundreds of femtoseconds, thereby effectively correcting the timing offset between the sampling points, avoiding occurrence of harmonic in a signal obtained after analog-to-digital conversion, enlarging an SFDR, and improving conversion precision of an ADC.

Embodiment 5

Figure 14:
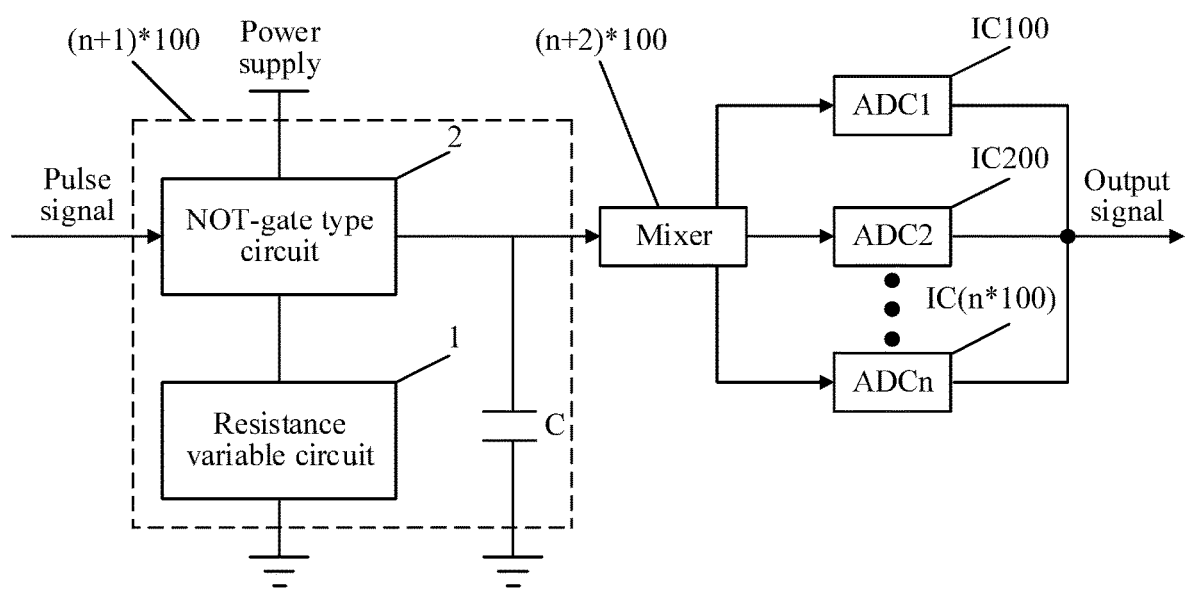
FIG. 14 is a schematic structural diagram of an ADC according to Embodiment 5 of the present application.

This embodiment of the present application provides an ADC. Referring to FIG. 14, the ADC includes n ADC chips IC100 to IC(n*100), a sampling clock generating circuit (n+1)*100, and a mixer (n+2)*100, where the sampling clock generating circuit (n+1)*100 is connected to the mixer (n+2)*100, and the mixer (n+2)*100 is connected to the n ADC chips IC100 to IC(n*100).

The sampling clock generating circuit (n+1)*100 may be the same as the sampling clock generating circuit provided by any embodiment of Embodiment 1 to Embodiment 4.

The mixer (n+2)*100 is configured to generate n channels of sampling signals whose periods are n*T, where within each period n*T, a level of an $i^{th}$ channel of sampling signals is the same as a level of an output signal of the sampling clock generating circuit (n+1)*100 in an $(i-1)^{th}$ time segment whose duration is T and is a low level within other time segments, and an $i^{th}$ ADC chip uses the $i^{th}$ channel of sampling signals as a sampling clock. For example, when n=2, as shown in FIG. 15, the mixer generates two channels of sampling signals whose periods are 2T, and in a theoretical case, within each period 2T, a level of a first channel of sampling signals is the same as the level of the output signal of the sampling clock generating circuit (n+1)*100 (an input signal of the mixer (n+2)*100) in a first time segment whose duration is T and is a low level within other time segments, and a level of a second channel of sampling clock signals is the same as the level of the output signal of the sampling clock generating circuit (n+1)*100 (the input signal of the mixer (n+2)*100) in a second time segment whose duration is T and is a low level within other time segments.

Figure 15:
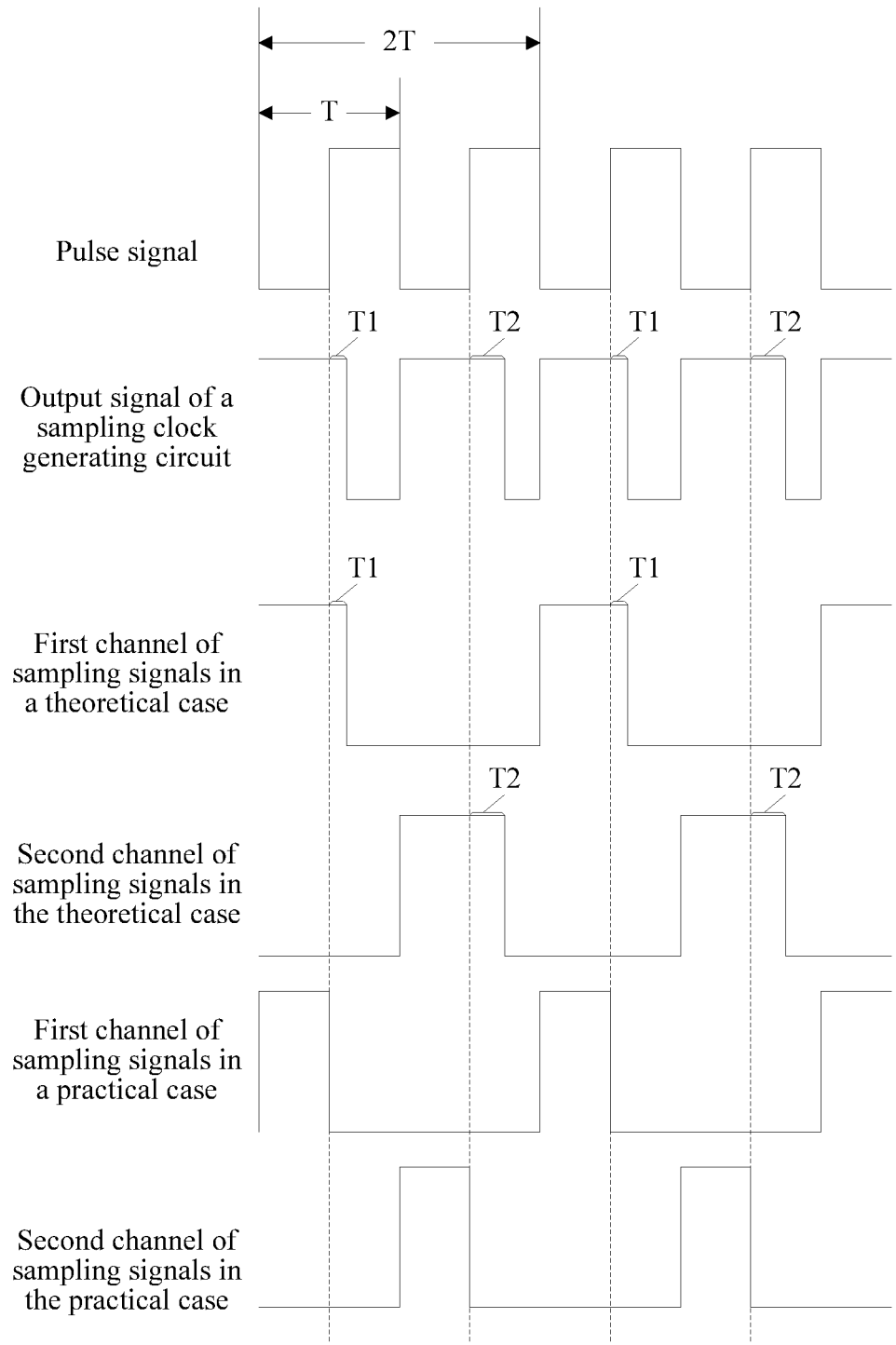
FIG. 15 is a schematic waveform diagram of an output signal in theoretical and practical cases and an input signal of a mixer according to Embodiment 5 of the present application.

It may be understood that in an actual application, because features of devices of the mixer (n+2)*100 cannot reach theoretical features, a timing offset exists between sampling points of the n channels of signals generated by the mixer (n+2)*100 and sampling points of the output signal of the sampling clock generating circuit (n+1)*100, and as long as a timing offset between sampling points of the output signal of the sampling clock generating circuit (n+1)*100 is properly adjusted, a timing offset between sampling points that is generated due to the features of the devices in the mixer (n+2)*100 can be canceled such that the mixer (n+2)*100 generates n channels of sampling signals whose periods are n*T and that have a same frequency and different phases, and sampling points of the n channels of sampling signals are the same as sampling points of a pulse signal, as shown in FIG. 15.

In this embodiment of the present application, an RC circuit is formed using a variable resistance circuit, a NOT-gate type circuit, and a capacitor, and when a pulse signal is changed from a low level to a high level, the capacitor discharges using the RC circuit such that because of a discharge function, a level of an output signal of the sampling clock generating circuit consisting of the variable resistance circuit, the NOT-gate type circuit, and the capacitor is not immediately changed from a high level to a low level with a level change of the pulse signal, but is maintained at a high level for a period of time and then changed to a low level. If a timing offset between sampling points that is caused by duration within which a high level is maintained is used to cancel a timing offset between sampling points that is generated by dividing the output signal of the sampling clock generating circuit into n channels using a logic circuit or another circuit, the timing offset between the sampling points can be adjusted. Because duration within which a high level is maintained is related to a resistance value of the variable resistance circuit, according to a relational expression between the duration within which a high level is maintained and the resistance value of the variable resistance circuit, even if adjustment precision of the resistance value of the variable resistance circuit just reaches an average level, adjustment precision of the duration within which a high level is maintained is relatively high and adjustment precision of the timing offset between the sampling points can reach hundreds of femtoseconds, thereby effectively correcting the timing offset between the sampling points, avoiding occurrence of harmonic in a signal obtained after analog-to-digital conversion, enlarging an SFDR, and improving conversion precision of an ADC.

The sequence numbers of the foregoing embodiments of the present application are merely for illustrative purposes, and are not intended to indicate priorities of the embodiments.

A person of ordinary skill in the art may understand that all or some of the steps of the embodiments may be implemented by hardware or a program instructing related hardware. The program may be stored in a computer-readable storage medium. The storage medium may include a read-only memory, a magnetic disk, an optical disc, or the like.

The foregoing descriptions are merely exemplary embodiments of the present application, but are not intended to limit the present application. Any modification, equivalent replacement, and improvement made without departing from the principle of the present application shall fall within the protection scope of the present application.

The invention claimed is:

1. An analog to digital converter (ADC), comprising:
an inverter comprising:
   an input end configured to receive a pulse signal having a period (T);
   an output end;
   a power supply terminal configured to directly couple to a power supply; and
   a ground terminal,
   wherein the inverter is configured to output a reverse signal based on the pulse signal;
a variable resistance circuit comprising:
   a first end coupled to the ground terminal of the inverter;
   a second end configured to be grounded; and
   a plurality of resistance elements each configured to be selectively connected between ground and the inverter respectively using a plurality of gate switches,
   wherein a resistance value of the variable resistance circuit is configured to alternate between a first value and a second value based on a period defined by n*T, wherein the first value and the second value are different from each other, and wherein n is an integer value ≥2;
a sampling signal generator coupled to the output end of the inverter and configured to generate n channels of sampling signals; and
n ADC channels each connected to a respective one of the n channels of sampling signals and configured to use the respective one of the n channels of sampling signals as a sampling clock.

2. The ADC according to claim 1, wherein each resistance element of the plurality of resistance elements comprises a resistor.

3. The ADC according to claim 1, wherein each resistance element of the plurality of resistance elements comprises a transistor.

4. The ADC according to claim 1, wherein each resistance element of the plurality of resistance elements comprises a resistor and a transistor.

5. The ADC according to claim 1, wherein the inverter further comprises a phase inverter.

6. The ADC according to claim 1, wherein the inverter further comprises a Not And (NAND) gate circuit.

7. The ADC according to claim 1, wherein the inverter comprises a Not Or (NOR) gate circuit.

8. The ADC according to claim 1, wherein a level of the pulse signal and the resistance value of the variable resistance circuit are configured to change non-simultaneously.

9. An analog to digital converter (ADC), comprising:
an inverter comprising a power supply terminal and configured to:
   receive a pulse signal having a period (T); and
   output a reverse signal based on the pulse signal, wherein the power supply terminal is configured to directly couple to a power supply;
a variable resistance circuit coupled to the inverter and comprising a plurality of resistance elements each configured to be selectively connected between ground and the inverter respectively using a plurality of gate switches, wherein a resistance value of the variable resistance circuit is configured to alternate between a first value and a second value based on a period defined by n*T, wherein the first value and the second value are different from each other, and wherein n is an integer value ≥2;
a sampling signal generator coupled to an output end of the inverter and configured to generate n channels of sampling signals; and
n ADC channels each connected to a respective one of the n channels of sampling signals and configured to use the respective one of the n channels of sampling signals as a sampling clock.

10. The ADC according to claim 9, wherein each resistance element of the plurality of resistance elements comprises at least one of a resistor or a transistor.

11. The ADC according to claim 9, wherein the inverter comprises a phase inverter, a Not And (NAND) gate circuit, or a (Not Or) NOR gate circuit.

12. The ADC according to claim 9, wherein a level of the pulse signal and the resistance value of the variable resistance circuit are changed non-simultaneously.

13. An apparatus, comprising:
an inverter comprising:
   an input end configured to receive a pulse signal having a period (T), wherein the inverter is configured to output a reverse signal based on the pulse signal;
   an output end; and
   a power supply terminal configured to directly couple to a power supply;
a variable resistance circuit comprising:
   a first end coupled to a ground terminal of the inverter;
   a second end being grounded; and
   a plurality of resistance elements each configured to be selectively connected between ground and the inverter respectively using a plurality of gate switches;
   wherein a resistance value of the variable resistance circuit is configured to alternate between a first value and a second value based on a period defined by n*T, wherein the first value and the second value are different from each other, and wherein n is an integer value ≥2;

a sampling signal generator coupled to the output end of the inverter and configured to generate n channels of sampling signals; and n ADC channels each connected to a respective one of the n channels of sampling signals and configured to use the respective one of the n channels of sampling signals as a sampling clock.

14. The apparatus according to claim 13, wherein each resistance element of the plurality of resistance elements comprises a resistor.

15. The apparatus according to claim 13, wherein each resistance element of the plurality of resistance elements comprises a transistor.

16. The apparatus according to claim 13, wherein the inverter comprises a phase inverter, a Not And (NAND) gate circuit, or a (Not Or) NOR gate circuit.

17. The apparatus according to claim 13, wherein a level of the pulse signal and the resistance value of the variable resistance circuit are changed non-simultaneously.

* * * * *